United States Patent
Loke et al.

(10) Patent No.: US 7,312,664 B2
(45) Date of Patent: Dec. 25, 2007

(54) METHODS AND APPARATUSES FOR TESTING A VOLTAGE-CONTROLLED OSCILLATOR (VCO) TO VERIFY OPERATION ACROSS SUPPLY VOLTAGE AND/OR TEMPERATURE

(75) Inventors: Alvin Leng Sun Loke, Fort Collins, CO (US); Michael Joseph Gilsdorf, Fort Collins, CO (US)

(73) Assignee: Avago Technologies General IP Pte Ltd, Singapore (SG)

( * ) Notice: Subject to any disclaimer, the term of this patent is extended or adjusted under 35 U.S.C. 154(b) by 94 days.

(21) Appl. No.: 11/210,421

(22) Filed: Aug. 24, 2005

(65) Prior Publication Data

US 2007/0052485 A1    Mar. 8, 2007

(51) Int. Cl.
    *H03L 7/00* (2006.01)
(52) U.S. Cl. ............... 331/16; 331/179; 331/34; 331/177 R
(58) Field of Classification Search .............. 331/16, 331/176, 179, 34, 177 R
    See application file for complete search history.

(56) References Cited

U.S. PATENT DOCUMENTS 4,728,906 A * 3/1988 Turl et al. ................. 331/4

* cited by examiner

*Primary Examiner*—Arnold Kinkead

(57) ABSTRACT

Methods and apparatuses for testing a calibrated VCO to determine whether the VCO has adequate fine frequency tuning capability. A range of coarse frequency tuning calibration settings are determined from coarse frequency tuning calibration settings obtained during a coarse frequency tuning calibration process. A determination is then made as to whether a fine frequency tuning capability of the VCO is adequate based on the determined range of coarse frequency tuning calibration settings.

17 Claims, 11 Drawing Sheets

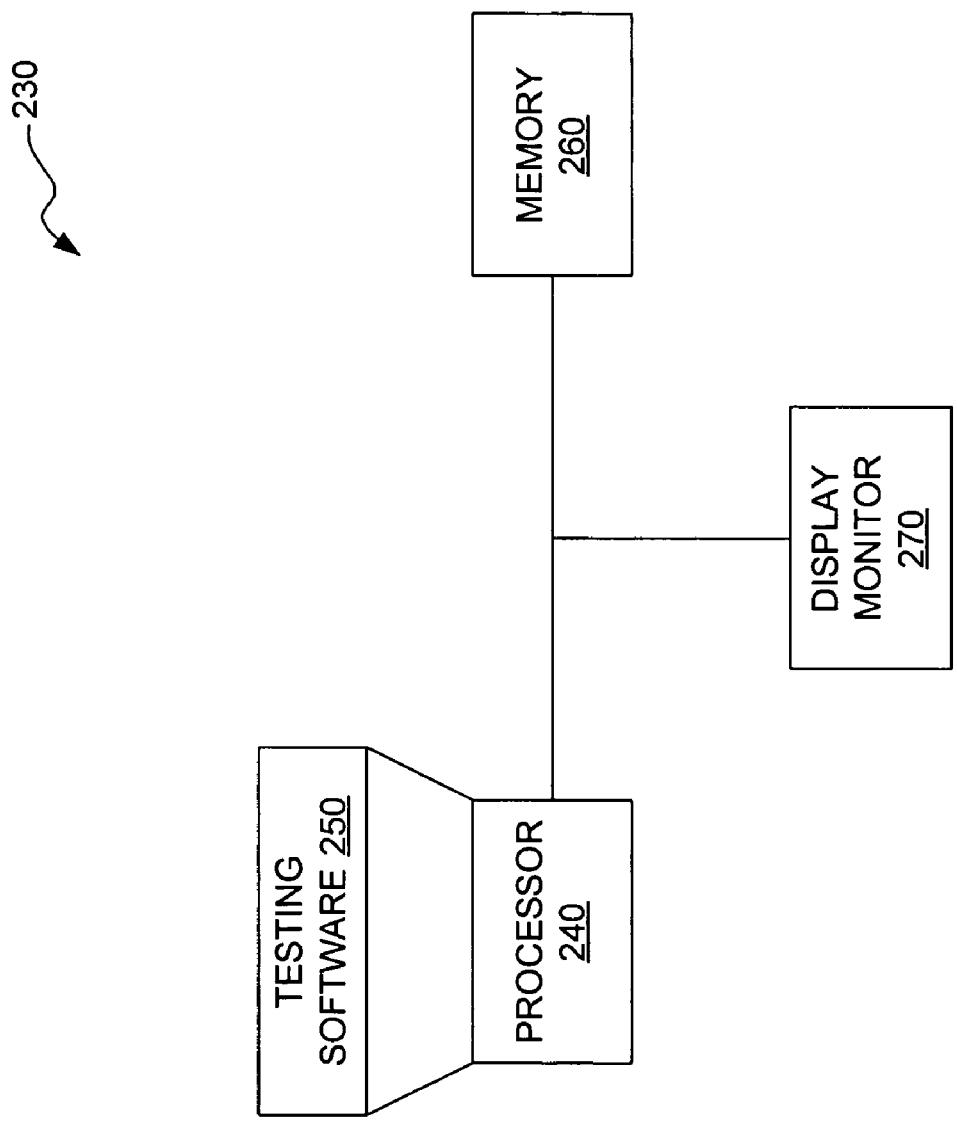

METHODS AND APPARATUSES FOR TESTING A VOLTAGE-CONTROLLED OSCILLATOR (VCO) TO VERIFY OPERATION ACROSS SUPPLY VOLTAGE AND/OR TEMPERATURE

BACKGROUND OF THE INVENTION

Voltage-controlled oscillators (VCOs) are commonly used in phase-locked loops (PLLs) to perform the function of frequency synthesis. FIG. 1 illustrates a block diagram of a known PLL 1 that is configured to perform frequency synthesis. The PLL 1 is a negative feedback control system that maintains a known phase and frequency relationship between the output clock 3 of the VCO 2 and the input reference clock (REFCLK) 4. The phase comparator 5 compares the phase of the output clock 3 with the phase of the input reference clock 4 to produce a phase error signal corresponding to the difference between the phase of the output clock 3 and the phase of the input reference clock 4. In cases where the PLL 1 includes a frequency divider 7 for performing multiplication of the input reference clock frequency, the output clock 3 is divided by some frequency divider value to convert the output clock signal into a feedback signal having a frequency that substantially matches the frequency of the input reference clock 4. The loop filter 6 processes the phase error signal output from the phase comparator 5 and produces a control voltage signal accordingly to steer VCO 2 over the frequency tuning range of the VCO 2 in order to maintain phase lock with the reference clock 4. The loop filter 6 characteristics are designed to achieve PLL 1 dynamic responses that are tailored for the intended PLL application.

In the example shown in FIG. 1, $f_{vco}=N_{PLL} \times f_{REFCLK}$, where $f_{vco}$ is the frequency of the output clock 3 of the PLL 1, $N_{PLL}$ is the frequency divider value of the frequency divider 7 and $f_{REFCLK}$ is the frequency of the input reference clock 4. For fixed frequency operation, some frequency tunability range is normally incorporated into the VCO 2 since the output clock 3 frequency of the VCO 2 has inherent sensitivities to the operating supply voltage ($V_{DD}$) and to temperature, as well as to statistical variations in circuit manufacturing. In many PLL implementations, it is desirable that the VCO spans a wider range of output frequencies given the same range of VCO control voltage input. Advantages include cost and power savings gained from employing simpler system architectures for multi-frequency applications. However, incorporating such a large tuning range increases the susceptibility of the VCO to noise injected additively at the control voltage node, which often renders such PLLs inadequate for implementations that require extremely low jitter performance. In other words, a given voltage noise level generates significantly greater frequency modulation at the output of a VCO with a significantly larger tuning range compared to the amount of frequency modulation generated by the same voltage noise level at the output of a VCO with a smaller tuning range.

Fortunately, the entire frequency tuning range is not continuously required in all PLL implementations. For example, in high-speed serial data communications, once a data rate or frequency is selected, the PLL operates at this frequency uninterrupted until another data rate is selected. In such instances, PLLs with calibrated VCOs prove useful. FIG. 2 illustrates a block diagram of a PLL 10 that includes a calibrated VCO 12. The PLL 10 shown in FIG. 2 operates in essentially the same manner in which the PLL 1 shown in FIG. 1 operates, except that the VCO 12 shown in FIG. 2 is a calibrated VCO whereas the VCO 2 shown in FIG. 1 is not a calibrated VCO. The components 15, 16 and 17 shown in FIG. 2 are identical to components 5, 6 and 7, respectively, shown in FIG. 1.

Calibrated VCOs of the type shown in FIG. 2 utilize two sets of frequency-tuning elements that are driven by independent sets of control voltages, as described below with reference to FIG. 3. During the calibration sequence, the coarse frequency control signal or signals is determined based on the selected input REFCLK clock frequency. Following calibration, normal PLL operation ensues with the fine frequency control signal output from the loop filter 16 adjusting the VCO input to compensate for VCO sensitivities to $V_{DD}$ and temperature drifts from the calibration condition.

FIG. 3 illustrates a block diagram of an implementation example of the calibrated VCO 12 shown in FIG. 2. The calibrated VCO 12 has a pair of ideally identical inductors 21 and 22, variable capacitors 23 and 24, and cross-coupled gain transistors 25 and 26. Each resonant tank 27 and 28 oscillates differentially with respect to the other tank at a frequency, $f=\frac{1}{2}\pi(LC)^{0.5}$, where L is the value of the inductance of the tank inductor and C is the value of the total capacitance of the tank. The cross-coupled gain transistors 25 and 26 periodically inject energy into the tanks 27 and 28 to sustain oscillations that would otherwise decay and disappear due to parasitic resistive losses in the inductors and capacitors.

Employing a calibrated VCO provides better jitter performance as long as the coarse frequency tuning elements have less susceptibility to control voltage noise in comparison to the fine frequency tuning elements. The VCO 12 shown in FIG. 3 is a resonant inductor-capacitor (LC)-based VCO that employs an array of inversion-mode MOSFET varactors 23 and 24 that function as nonlinear voltage-controlled capacitors to tune the VCO. Each of the varactors 23 and 24 receives a control voltage that is independently controlled, though varactors 23 are typically controlled by a set of control voltages. The VCO 12 has M and N varactors 23 and 24, respectively, (where M and N are integers) for coarse and fine frequency tuning, respectively. The VCO output frequency is given by:

$$f_{vco} \approx \frac{1}{2\pi/\sqrt{LC_{total}}}$$

$$= \frac{1}{2\pi\sqrt{L \cdot \left(C_o + \sum_{k=1}^{M} C_{coarse,k} + NC_{fine}\right)}}$$

where $C_o$=fixed capacitance in the tank due to the cross-coupled transistors and parasitics, $C_{coarse,k}$=capacitance contribution of the $k^{th}$ coarse frequency tuning varactor, and $C_{fine}$=capacitance contribution of each fine frequency tuning varactor.

FIG. 4 illustrates a plot 30 of gate capacitance versus control voltage that demonstrates the capacitance-voltage (C-V) characteristics for an n-channel inversion-mode MOSFET varactor of the type used in the VCO 12 shown in FIG. 3. The control voltage for the fine frequency tuning varactors 24 would nominally be positioned somewhere along the depletion-to-inversion transition 31 (highly sloped region of C-V characteristic plot 30). On the other hand, control voltages for the coarse frequency tuning varactors 23 would be driven to either GND or $V_{DD}$, depending on the required calibration setting, such that the coarse frequency may be modulated by a total capacitance of MΔC across the coarse tuning range of the VCO. The flatness of the capacitance vs. voltage (C-V) characteristic at control voltages of GND and $V_{DD}$ translates to minimal jitter or associated frequency modulation induced by noise added to the coarse control voltage line.

Calibrated VCOs require some sort of calibration algorithm state machine that determines the coarse calibration setting, CS, for the corresponding M coarse frequency tuning varactor control voltages for a given input reference frequency ($f_{REFCLK}$). In the example shown, such a state machine would determine how many of the M varactors 23 are driven to $V_{DD}$ and how many are driven to GND. In a numerical illustration, if it is assumed that CS=15 is required to calibrate closely to some reference frequency, e.g., 125 MegaHertz (MHz), then 15 coarse varactor control voltages are driven to $V_{DD}$ and (M-15) coarse varactor control voltages are driven to GND. The calibration algorithm is also responsible for effectively driving the fine frequency tuning varactors 24 to their average value, which is commonly referred to as "midrailing" the capacitors, during calibration. This ensures that immediately after calibration, the PLL has approximately equal bidirectional tuning range of approximately ±½ NΔC.

As previously mentioned, fine frequency tuning enables the PLL to compensate for VCO frequency sensitivities to allowable $V_{DD}$ and temperature drifts following calibration. Incorporating excessive fine frequency tuning range is not prudent as it compromises jitter performance. Consequently, an optimized VCO design should have just enough fine frequency tuning to compensate for such sensitivities but not so much tuning so as to introduce substantial jitter. Furthermore, it is imperative that these sensitivities be measured in order to confirm that sufficient fine frequency tuning is available when the PLL is operating in the field.

One technique that is currently used for measuring such sensitivities is known as the direct measurement approach. The direct measurement approach involves calibrating the oscillator at some input frequency, supply voltage ($V_{DD}$) and temperature condition, and then measuring the PLL output jitter at other supply voltage and temperature conditions. If the VCO is forced to operate beyond its fine frequency tuning limits, the PLL will be unable to compensate for the VCO sensitivities and will generate excessive output jitter as a result. In essence, if the VCO is forced to operate beyond its fine frequency tuning capabilities, then the PLL that employs the VCO will fail to maintain frequency and phase lock.

The calibration algorithm uses counters and other logic to determine, at each input reference clock frequency, which calibration setting produces a clock frequency at the output of the feedback frequency divider circuit that most closely matches the input reference clock frequency. With reference again to FIG. 2, during calibration, the phase comparator 15 is disabled and the fine tuning control voltage output from the loop filter 16 is "midrailed". A first counter 13 receives the input reference clock signal and a second counter 14 receives the clock frequency output from the feedback frequency divider 17. The counters 13 and 14 increment on the rising edges of the clock frequency signals. The counter values are output to a subtractor 18 that subtracts the value of counter 14 from the value of counter 13.

In one example of a calibration algorithm, the coarse tuning calibration setting ("coarse control voltage(s)") input to the VCO 12 is sequentially swept from its minimum calibration setting to its maximum calibration setting. At each setting, both counters 13 and 14 are initially reset, after which they will begin to increment at a rate proportional to the input reference clock and feedback clock frequencies. At the beginning of the calibration process, the value in the counter 13 will be greater than the value in the counter 14, and therefore the sign of the result of the subtraction will be positive. However, as the calibration setting is increased, at some point in time, the clock frequency output from the frequency divider will exceed the input reference clock frequency. At that point in time, the sign of the result of the subtraction will change from positive to negative. The calibration algorithm will then compare the magnitude of the result of the subtraction just before the change in sign with the magnitude of the result that caused the sign change. The coarse calibration setting associated with the smallest difference in magnitude will then be saved in memory as the calibration setting that corresponds to the associated input reference clock frequency and associated VCO output clock frequency (the VCO output clock frequency is equal to the input reference clock frequency times the frequency divider value).

Once the calibration settings have been determined for each input reference clock frequency, the VCO output clock jitter at each input frequency and at each possible permutation of supply voltage and temperature conditions must be measured and a determination must be made as to whether the PLL was unable to maintain lock due to the inability of the VCO to provide the necessary fine tuning.

This direct measurement approach has several important drawbacks. One drawback is that jitter measurements are difficult and tedious to obtain and can often be inaccurate. Obtaining the measurements is an extremely time consuming and cumbersome task because the measurements need to be repeated across many input reference clock frequencies, across all possible permutations of calibration conditions (i.e., $V_{DD}$ and temperature), and across possible permutations of $V_{DD}$ and temperature drifts from the calibration condition, and determinations must be made at each input reference clock frequency and set of conditions as to whether jitter in the VCO output clock indicates that the PLL is unable to maintain lock.

Accordingly, a need exists for a method and apparatus for easily and quickly making a determination as to whether the VCO has sufficient fine frequency tuning range over the range of input reference clock frequencies and over different permutations of supply voltage and temperature.

SUMMARY OF THE INVENTION

The invention provides a method and an apparatus for testing a calibrated VCO to determine whether the VCO has adequate fine frequency tuning capability. The apparatus comprises first logic configured to determine a range of coarse frequency tuning calibration settings based on a plurality of coarse frequency tuning calibration settings obtained during a coarse frequency tuning calibration process, and second logic configured to determine whether a fine frequency tuning capability of the VCO is adequate based on the determined range of coarse frequency tuning calibration settings.

The method for testing a calibrated VCO comprises determining a range of coarse frequency tuning calibration settings based on a plurality of coarse frequency tuning calibration settings obtained during a VCO coarse frequency tuning calibration process, and, based on the determined range of coarse frequency tuning calibration settings, determining whether a fine frequency tuning capability of the VCO is adequate.

The invention also provides a method for calibrating and testing a VCO to determine whether the VCO has adequate fine frequency tuning capability. In accordance with this embodiment, a coarse frequency tuning calibration process is performed to determine coarse frequency tuning calibration settings at a plurality of selected input reference clock frequencies and at a plurality of temperature and supply voltage conditions. The range of coarse frequency tuning calibration settings is then calculated based on the measured coarse frequency tuning calibration settings obtained during the coarse frequency tuning calibration process. Once the range of coarse frequency tuning calibration settings has been determined, the range is used to make a determination as to whether the fine frequency tuning capability of the VCO is adequate.

The invention also provides a computer program for testing a calibrated voltage-controlled oscillator (VCO) to determine whether the VCO has adequate fine frequency tuning capability. The computer program is embodied on a computer-readable medium and comprises a first code segment for determining a range of coarse frequency tuning calibration settings based on a plurality of coarse frequency tuning calibration settings obtained during a VCO coarse frequency tuning calibration process, and a second code segment for determining, based on the determined range of coarse frequency tuning calibration settings, whether a fine frequency tuning capability of the VCO is adequate.

These and other features of the invention will become apparent from the following description, drawings and claims.

BRIEF DESCRIPTION OF THE DRAWINGS

FIG. 11 illustrates a block diagram of the apparatus of the invention in accordance with an exemplary embodiment.

DETAILED DESCRIPTION OF THE PREFERRED EMBODIMENT

The invention overcomes the drawbacks of the direct measurement approach by exploiting the calibrated VCO coarse tuning characteristics as well as the tuning relationship between coarse and fine frequency tuning elements, both of which are easily measured across all $V_{DD}$ and temperature permutations of calibration conditions, in order to confirm if sufficient fine frequency tuning range is available for proper operation of the VCO. Unlike the direct measurement approach, in accordance with the invention, jitter is not measured. Instead, VCO coarse tuning characteristics (calibration setting vs. VCO frequency) are measured, which is substantially easier and faster than measuring jitter, for multiple frequencies, supply voltages and temperatures, and then the measurement information is used to determine whether the VCO may potentially be forced to operate beyond its fine frequency tuning limits. The manner in which this is accomplished is described below with reference to FIGS. 5-8.

Figure 5:
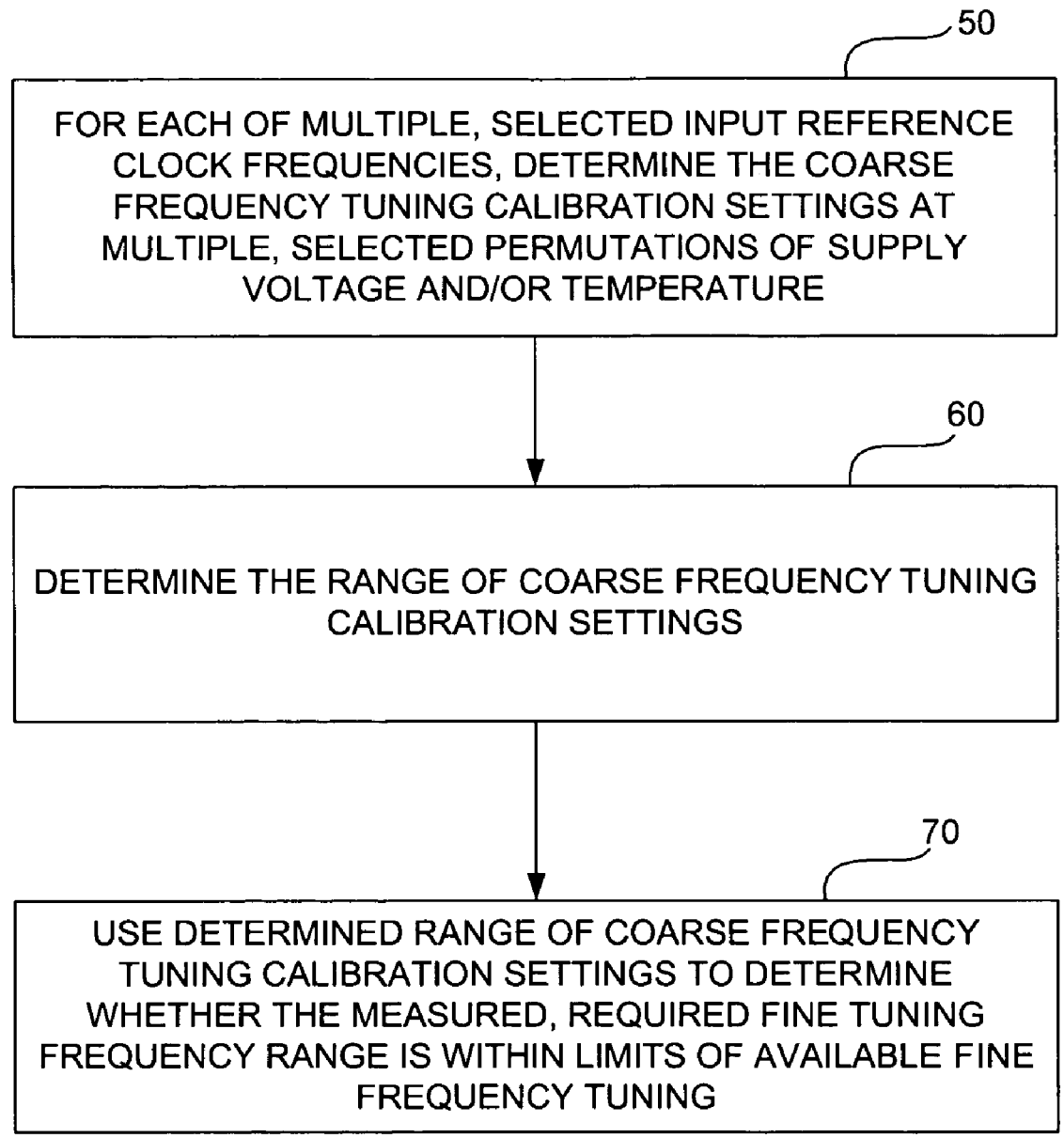
FIG. 5 illustrates a flow chart that represents the method of the invention in accordance with an exemplary embodiment.

FIG. 5 illustrates a flow chart that represents the method of the invention in accordance with an exemplary embodiment. The first step in the method is to determine the coarse frequency tuning control voltage settings for the PLL under test for each of multiple selected input reference clock frequencies at each of multiple selected temperature and supply voltage conditions, as indicated by block 50. The manner in which this is accomplished in accordance with an exemplary embodiment will be described with reference to FIGS. 6 and 7.

Figure 3:
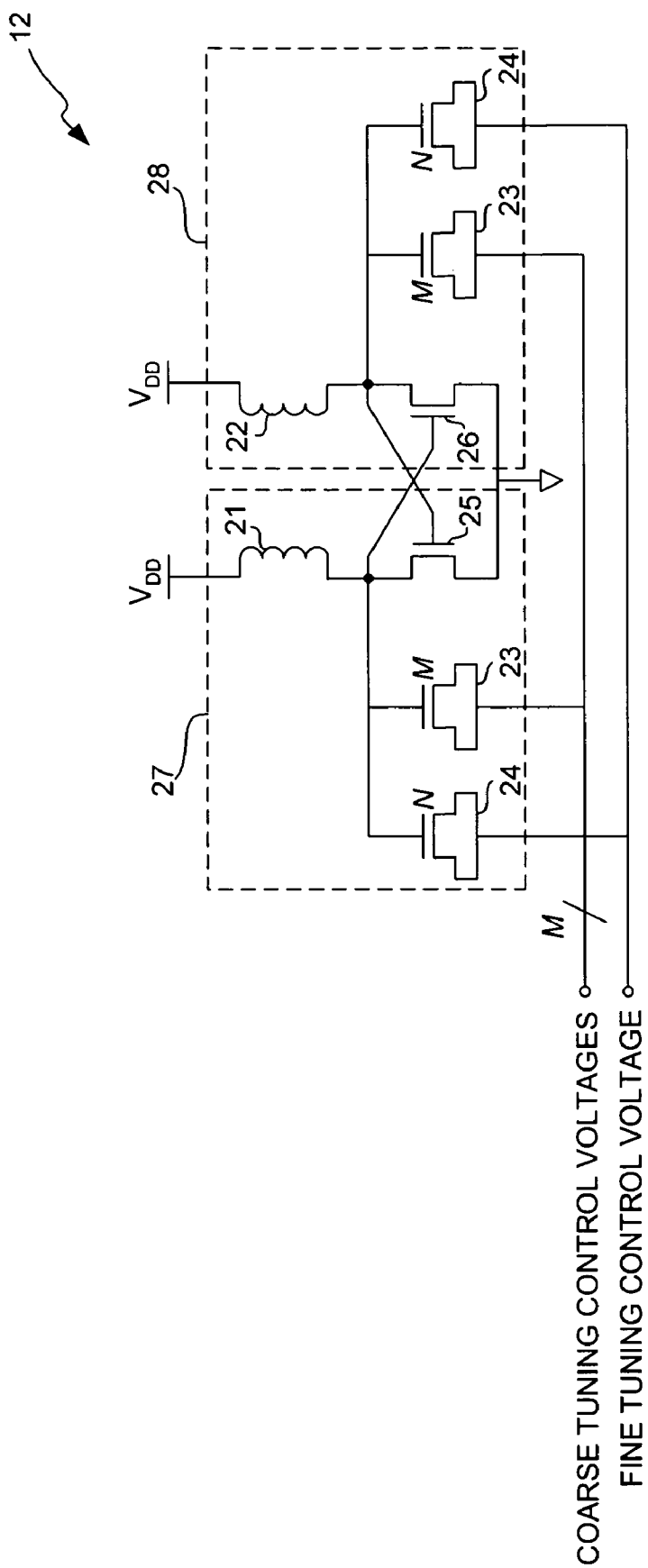
FIG. 3 illustrates a block diagram of an implementation example of the calibrated VCO shown in FIG. 2.
Figure 4:
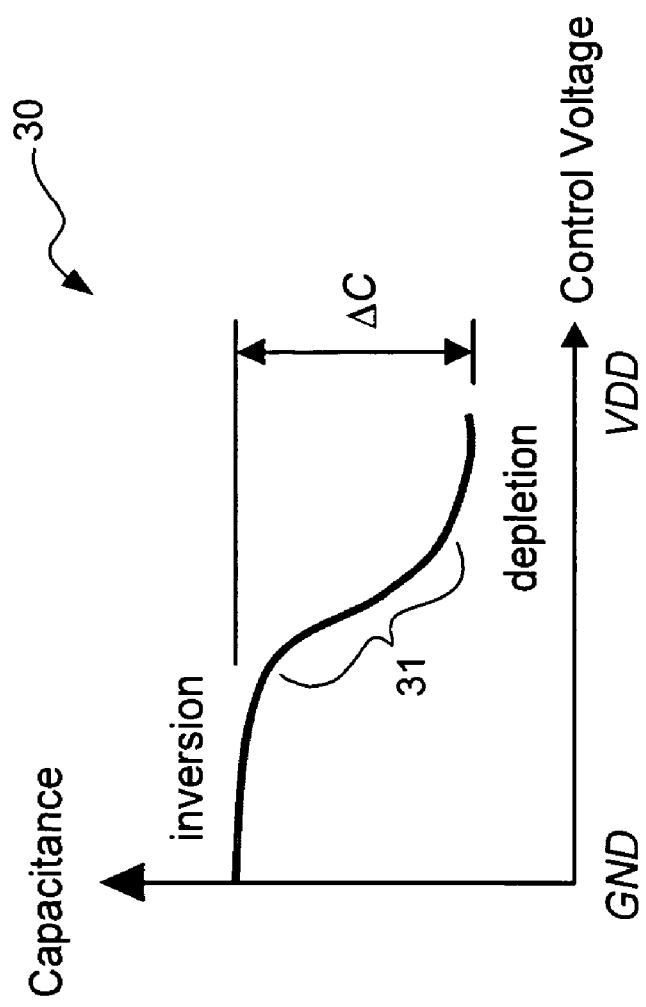
FIG. 4 illustrates a plot of gate capacitance versus control that demonstrates the capacitance-voltage (C-V) characteristics for an n-channel inversion-mode MOSFET varactor of the type used in the VCO shown in FIG. 3.
Figure 6:
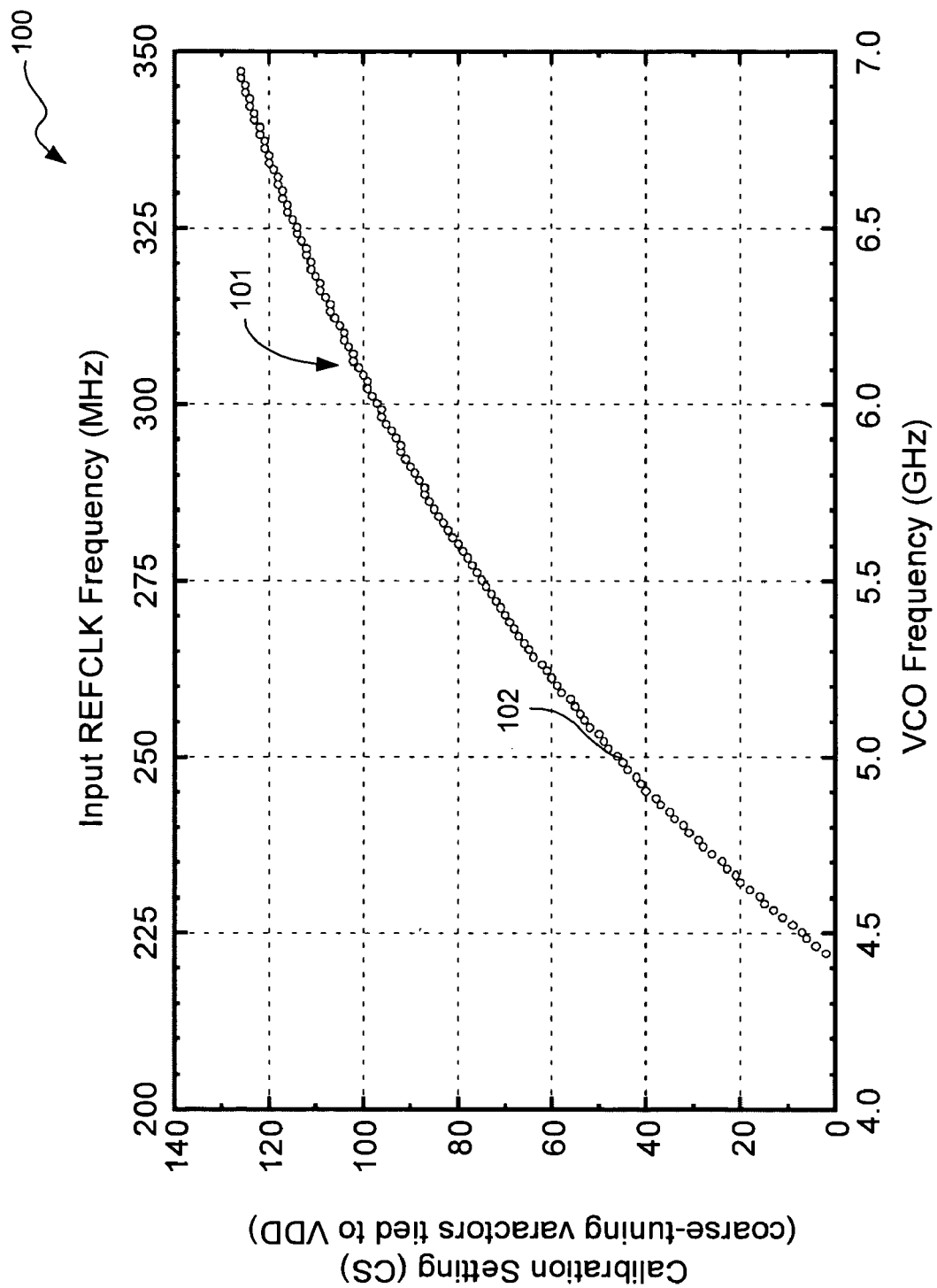
FIG. 6 illustrates an exemplary plot of a VCO tuning characteristic measured at nominal $V_{DD}$ and temperature for a calibrated LC-based VCO of the type shown in FIG. 3 having 127 coarse tuning inversion-mode varactors (M=127) and 20 fine tuning inversion-mode varactors (N=20).

FIG. 6 illustrates an exemplary plot 100 of a measured VCO tuning characteristic for a calibrated LC-based VCO of the type shown in FIG. 3 having 127 coarse tuning inversion-mode varactors (M=127) and 20 fine tuning inversion-mode varactors (N=20). In this example, the fine and coarse tuning varactors are identical. The characteristic plot 100 shown in FIG. 6 was obtained when the VCO was operating at a fixed supply voltage of $V_{DD}$=1.0 Volts (V) and a fixed temperature of 85° Celsius (C.). The PLL feedback divider value, $N_{PLL}$, is 20. Hence, the VCO will be phase-locked at a VCO frequency, $f_{vco}=20 \times f_{REFCLK}$. The calibration algorithm determines the coarse tuning calibration setting that is required to coarse-tune the VCO closest to an output frequency of $20 \times f_{REFCLK}$. For example, the point 102 on curve 101 corresponds to an input reference clock frequency of 250 MegaHertz (MHz), an output clock frequency of 5.0 GigaHertz (GHz) and a calibration setting of 44 (i.e., 44 of the M=127 varactors are driven to $V_{DD}$ and 83 of the M varactors are driven to GND).

Figure 1:
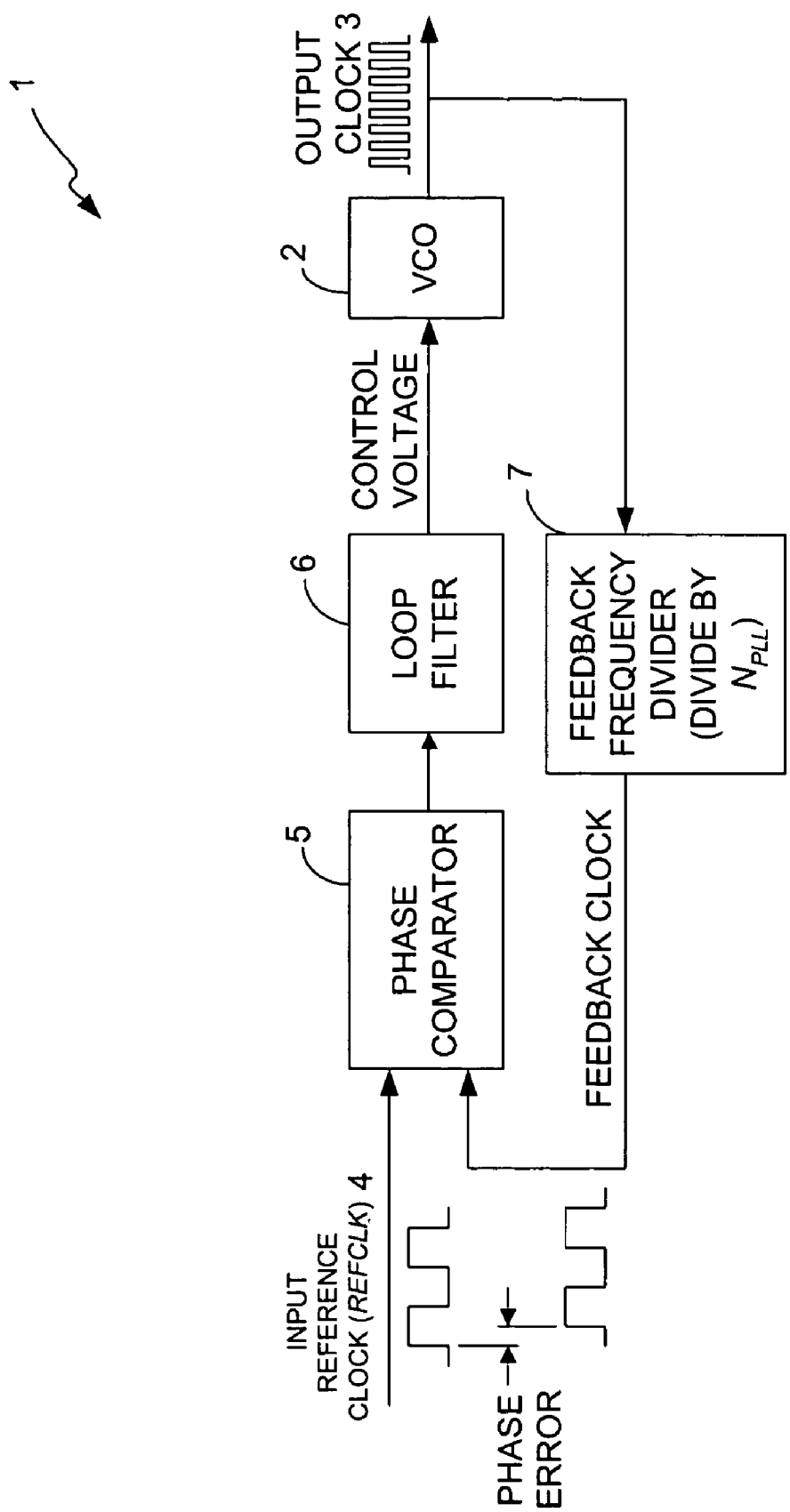
FIG. 1 illustrates a block diagram of a known PLL that is configured to perform frequency synthesis.
Figure 2:
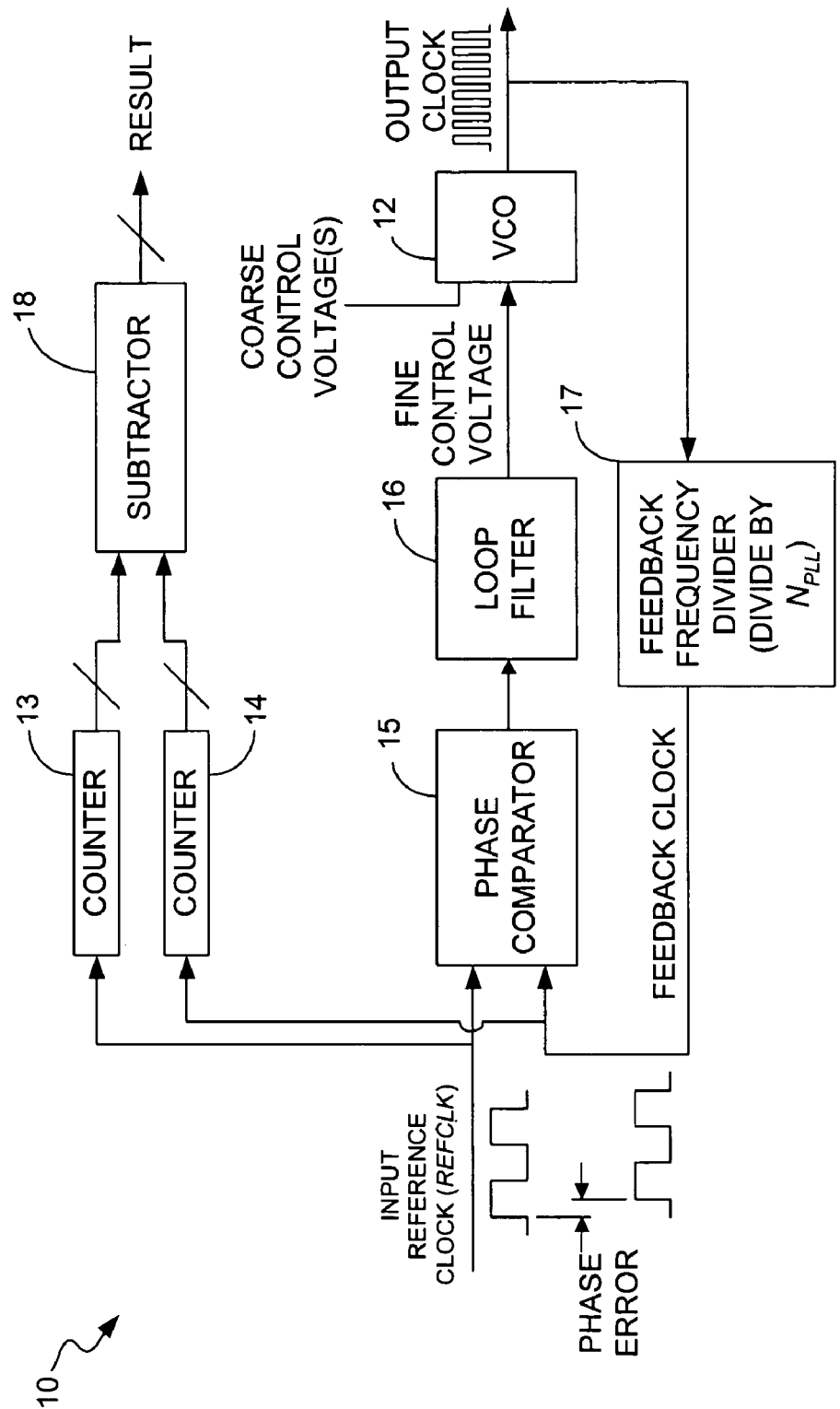
FIG. 2 illustrates a block diagram of a PLL that includes a calibrated VCO.

The input reference clock frequency of the PLL is then swept across a range of input reference clock frequencies. At each of various selected input reference clock frequencies, the coarse tuning calibration setting is adjusted until a determination is made that the input reference clock frequency matches the clock frequency output from the feedback frequency divider. The calibration setting that corresponds to the match is stored in memory in a way that associates the setting with the respective input reference clock frequency and the respective VCO output clock frequency. The calibration algorithm described above with reference to FIG. 2 may be used for this purpose. FIG. 6 illustrates the resulting characteristic plot 100.

Figure 7:
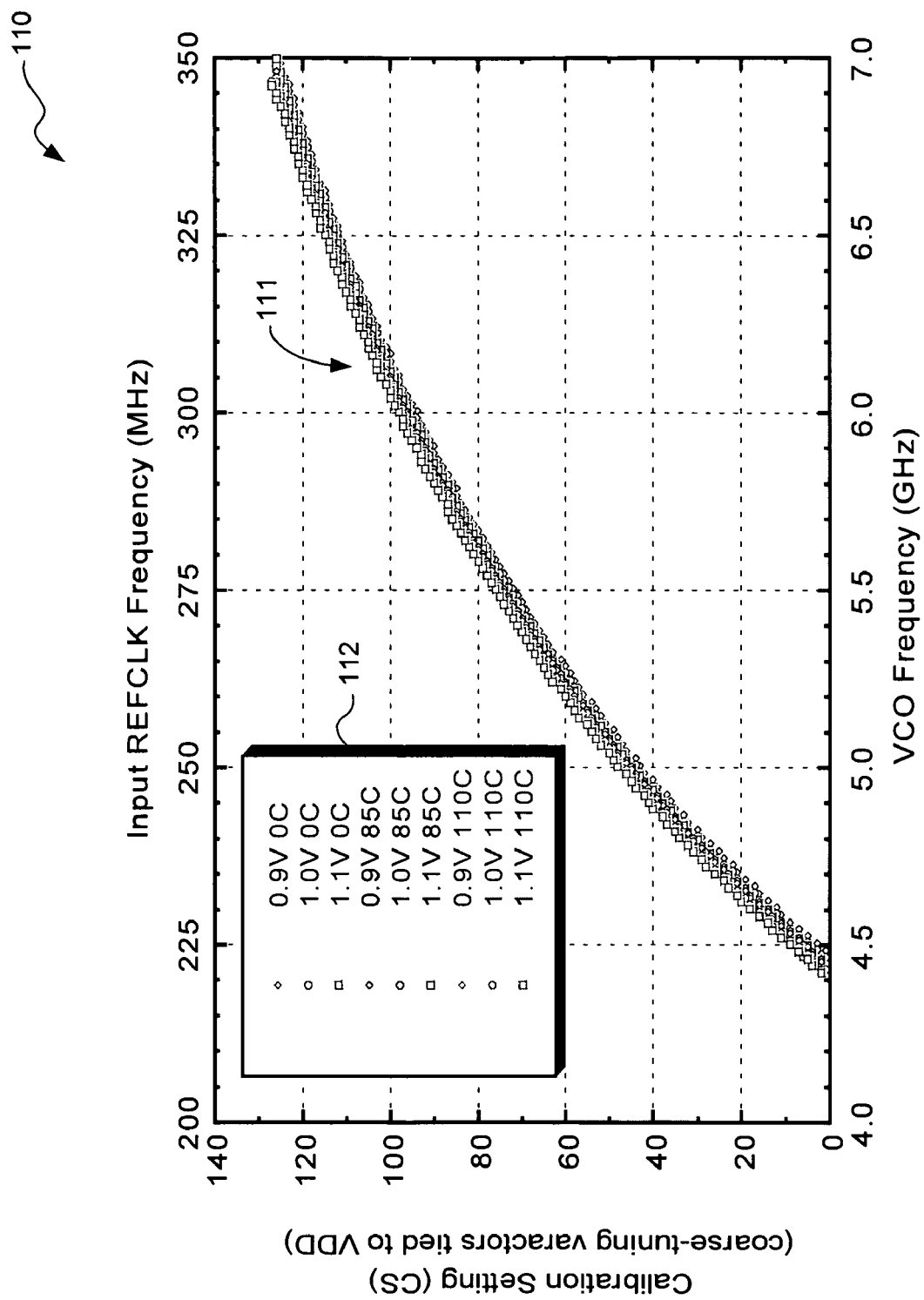
FIG. 7 illustrates the VCO coarse tuning characteristic plot for the VCO across supply voltage and temperature extremes, or corners.

In order to accomplish the steps represented by block 50 in FIG. 5, the calibration process described above with reference to FIG. 6 is carried out for multiple, selected permutations of supply voltage and/or temperature, as will now be described with reference to FIG. 7. FIG. 7 illustrates the VCO coarse tuning characteristic plot 110 for the VCO described above with reference to FIG. 6 across supply voltage and temperature extremes, or corners. The curve 111 in plot 110 is actually a composite of nine curves. The curve 101 shown in FIG. 6 corresponds to the central curve of the composite curve 111 shown in FIG. 7. Each of the nine curves corresponds to VCO coarse tuning characteristic plot obtained from measurements that were taken during calibration while the supply voltage and temperature conditions were maintained at one of the nine conditions listed in the box 112 shown in FIG. 7.

Figure 8:
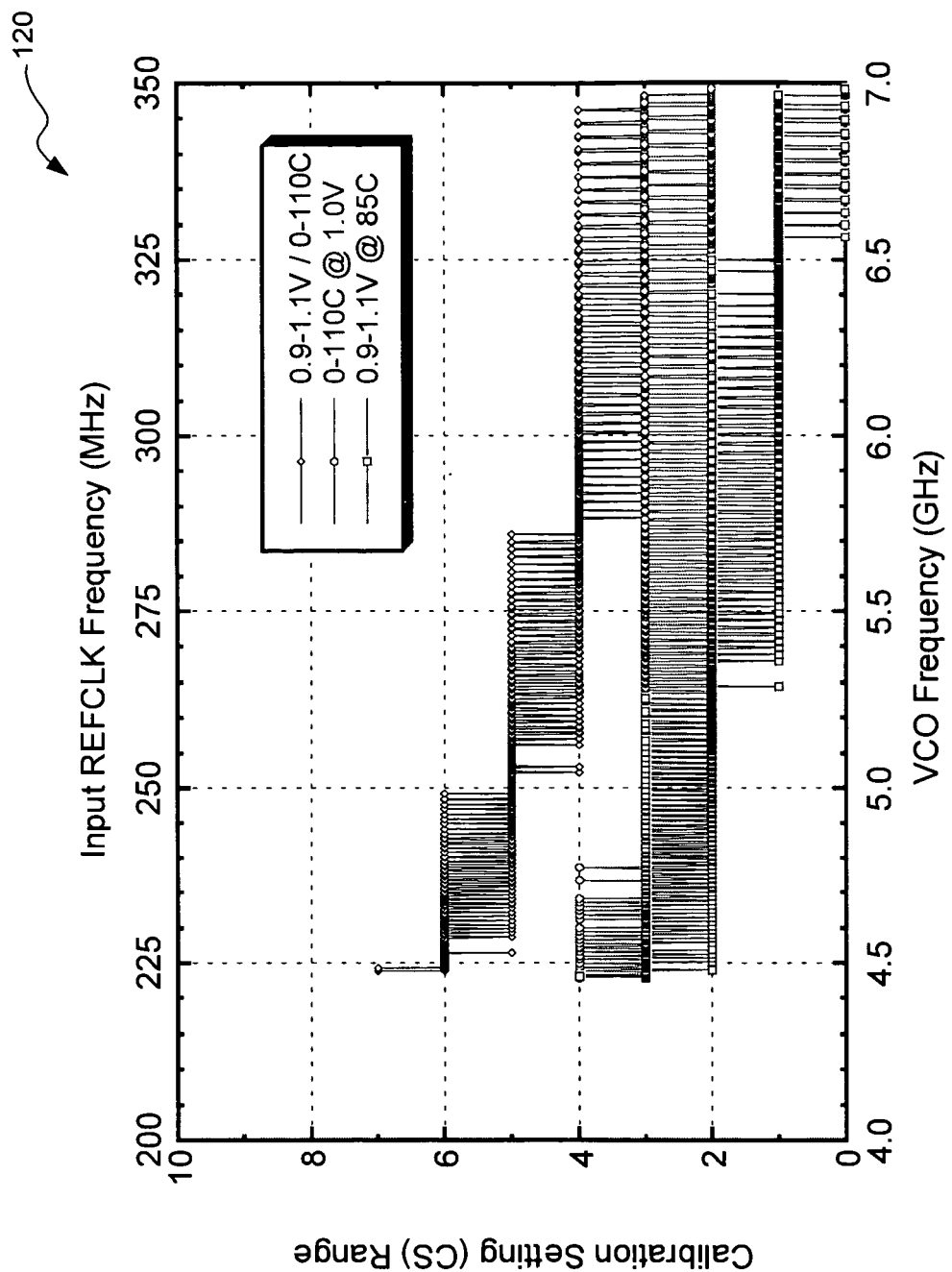
FIG. 8 illustrates a plot of VCO calibration settings range as a function of VCO output clock frequency.

Once the coarse calibration settings have been obtained, the range of the coarse calibration settings is determined at some VCO output clock frequency, as indicated by block 60 in FIG. 5. FIG. 8 illustrates a plot 120 of the VCO calibration settings range as a function of VCO output clock frequency. The plot 120 was generated using the same data that was obtained in order to generate the plot 110 shown in FIG. 7. The coarse tuning calibration settings range reflects the worst-case capacitance correction (normalized to $\Delta C$) that is needed to maintain frequency lock over worst-case $V_{DD}$ and temperature excursions when the VCO is calibrated at any allowed $V_{DD}$ and temperature condition. As can be seen in FIG. 8, the range of calibration settings span from zero to seven.

The coarse tuning calibration settings range is then used to determine whether the fine frequency tuning range will be sufficient to ensure that frequency and phase lock will always be maintain, as indicated by block 70 in FIG. 5. Since, in this example, the fine frequency tuning varactors are identical to the coarse frequency tuning varactors, a tuning adjustment of $10\Delta C$ (i.e., the total fine tuning adjustment available when the fine tuning varactors are midrailed during calibration) in the fine tuning varactors corresponds exactly to a tuning adjustment $10\Delta C$ in the coarse tuning varactors. Hence, as long as the fine tuning range that is available (i.e., $\frac{1}{2} \times 20\Delta C = 10\Delta C$) to ensure that frequency and phase lock can always be maintained across the range of the PLL is greater than the range in measured coarse frequency calibration setting, there will be sufficient post-calibration fine tuning to cover worst-case post-calibration $V_{pp}$ and temperature excursions.

It can be seen from FIG. 8 that the required capacitance correction (normalized in terms of $\Delta C$) across the entire tuning range of the VCO is seven, which is well below ten. Therefore, the VCO does not exhibit a post-calibration tuning range issue across allowed operating $V_{DD}$ and temperature that might prevent it from maintaining lock.

Additional information can also be derived from the calibration setting range information contained in the plot 120 shown in FIG. 8. For example, it can be seen from the plot 120 that the sensitivities of this type of LC-based VCO are more pronounced at lower frequencies than at higher frequencies. Moreover, the calibration setting range can be calculated across temperature only (i.e., at some fixed $V_{DD}$) or across $V_{DD}$ only (i.e., at some fixed temperature). The results shown in FIG. 8 graphically illustrate that VCO sensitivities to temperature are more dominant, especially at higher frequencies in the VCO coarse tuning range.

In the example given above, because the coarse tuning varactors were identical to the fine tuning varactors, the determination of available tuning range (normalized to $10\Delta C$ for N=20) is trivial. If the coarse and fine tuning varactors are not identical, the method of the invention can still be applied to determine available tuning range. For example, if the fine tuning $\Delta C$ ("$\Delta C_{fine}$") is different from the coarse tuning $\Delta C$ ("$\Delta C_{coarse}$"), then the limit would be adjusted to $\frac{1}{2}N \times (\Delta C_{fine}/\Delta C_{coarse})$, where N is the number of fine frequency tuning varactors.

Figure 9:
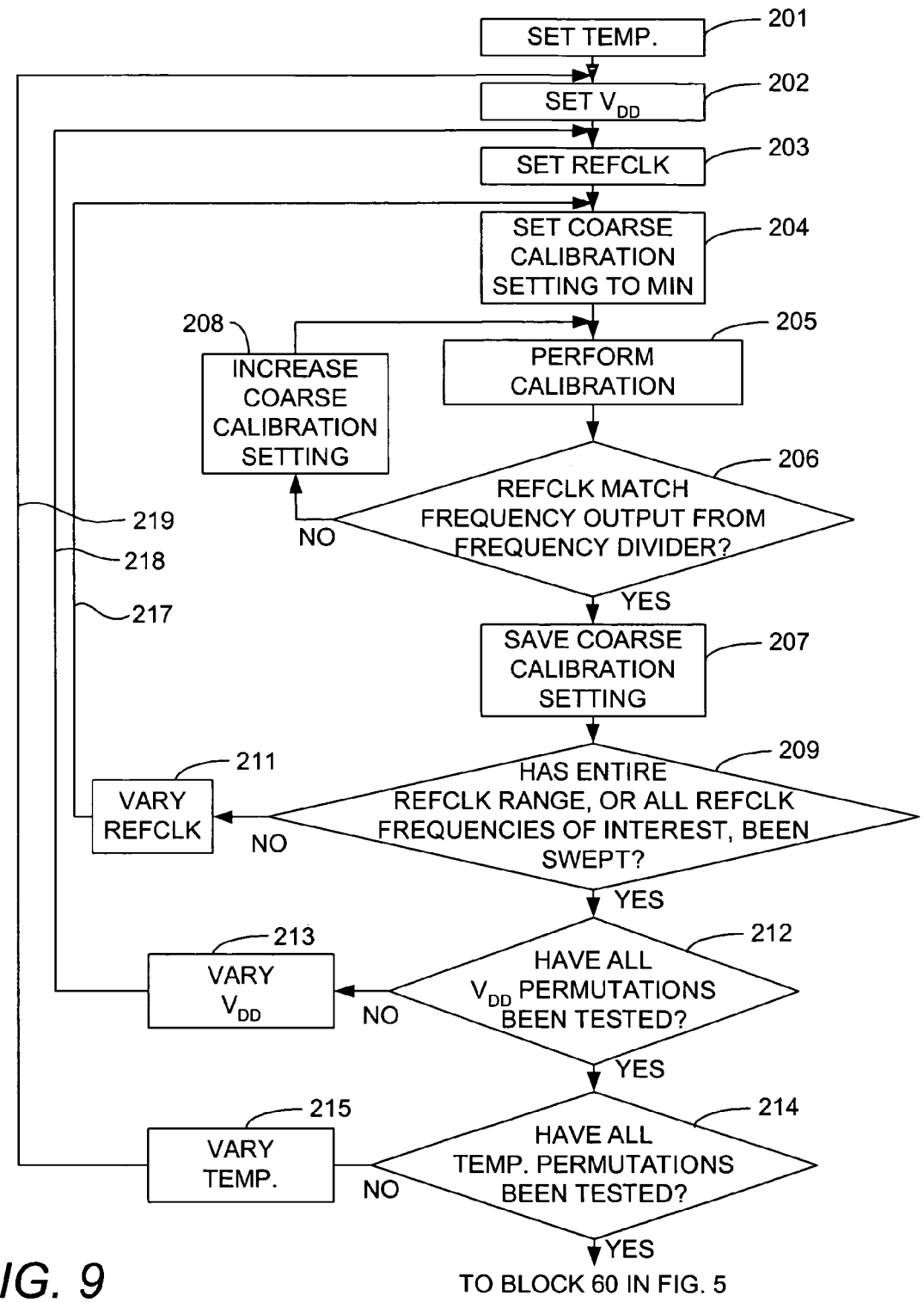
FIG. 9 illustrates a flow chart that represents a first exemplary embodiment of the invention for performing the portion of the algorithm represented by block 50 shown in FIG. 5.
Figure 10:
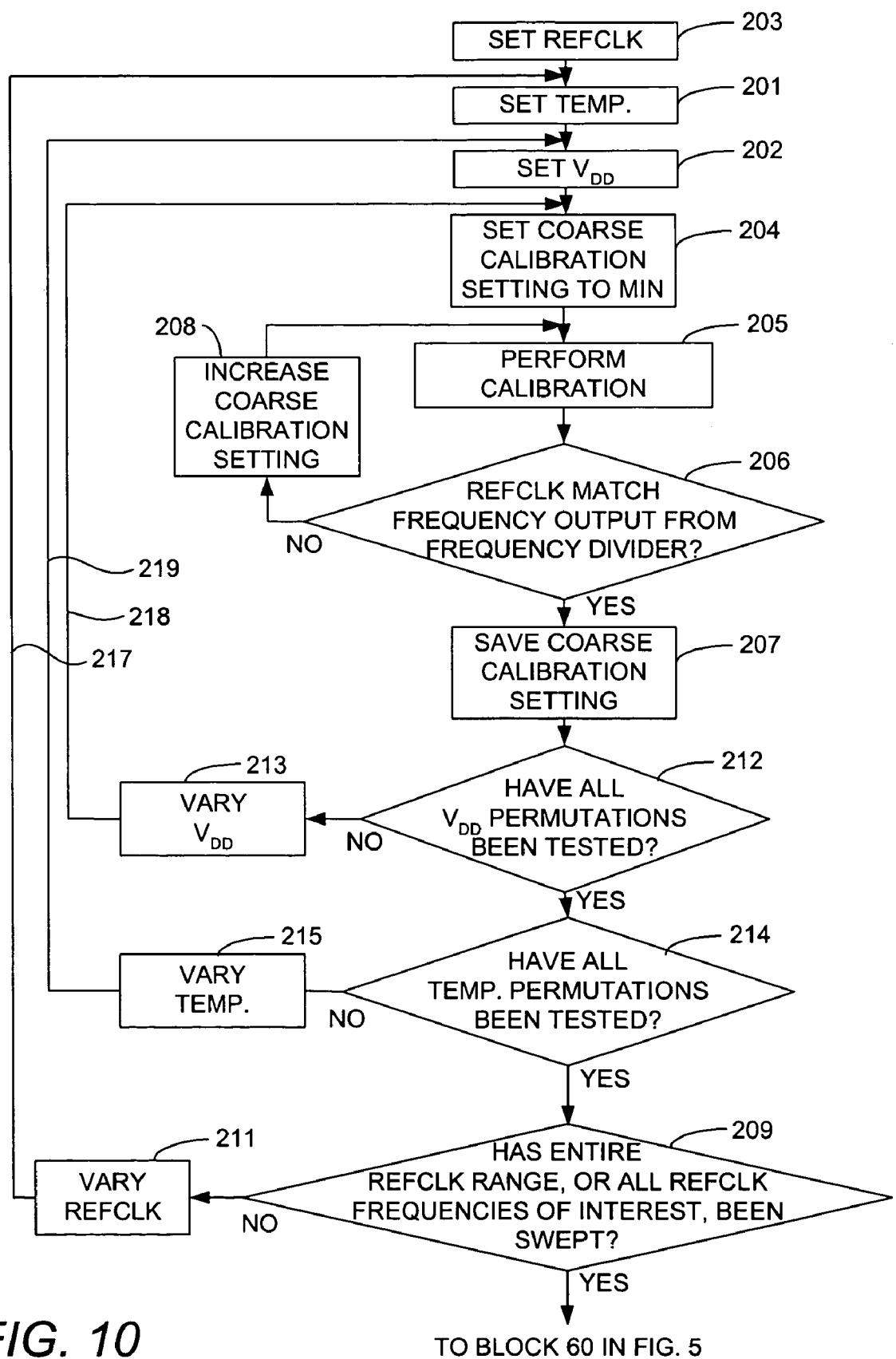
FIG. 10 illustrates a flow chart that represents a first exemplary embodiment of the invention for performing the portion of the algorithm represented by block 50 shown in FIG. 5.

FIGS. 9 and 10 illustrate flow charts that represent alternative embodiments for the performing calibration operations represented by block 50 shown in FIG. 5. As described above, in order to obtain the range of coarse tuning calibration settings, all of the coarse tuning calibration settings are determined across the range of input reference clock frequencies and permutations of supply voltage and temperature. FIGS. 9 and 10 demonstrate different ways to accomplish this. It should be noted, however, that the invention is not limited to performing these tasks in the manner depicted in FIGS. 9 and 10. Variations to the embodiments represented by the flow charts shown in FIGS. 9 and 10 may be used for this purpose.

As shown in FIG. 9, the temperature, supply voltage and input reference clock frequency are all set to some initial values, as indicated by blocks 201, 202 and 203, respectively. The PLL being tested has a frequency range over which it should operate. The initial setting for REFCLK may be the minimum frequency in this range. The initial settings for the temperature and supply voltage will typically be the minimum values that can be anticipated, such as, for example, 0° C. and 0.9 V, respectively. The coarse tuning calibration setting will also typically be initially set to its minimum value, as indicated by block 204.

Blocks 205, 206, 207 and 208 shown in FIG. 9 represented performance of the calibration process described above with reference to FIG. 2 for the initial settings of REFCLK, $V_{DD}$ and temperature. Once the calibration setting has been determined and stored in memory, a determination is made as to whether the calibration setting that was stored corresponded to the maximum REFCLK frequency in the REFCLK frequency range, or the last selected REFCLK frequency of interest (the process could use only a single REFCLK frequency), as indicated by block 209. If not, the REFCLK frequency will be incremented to the next selected higher frequency, as indicated by block 211, and the process with return to block 204, as indicated by loop 217. The calibration setting associated with this next REFCLK frequency will then be determined and stored in memory.

When a determination is made at block 209 that calibration has been performed at last REFCLK frequency, a determination is made at block 212 as to whether calibration has been performed at all of the selected permutations of supply voltage (e.g., the extremes), as indicated by block 212. If not, $V_{DD}$ is set to the next selected value at which calibration is to be performed, as indicated by block 213. The process then returns to block 203 and the REFCLK frequency is again set to its initial value, as indicated by loop 218. The process represented by blocks 204-211 is then performed and calibration settings are determined and saved for all of the selected REFCLK frequencies at the initial temperature set at block 201 and the new supply voltage set at block 213.

When a determination is made at block 212 that calibration settings have been obtained for all of the selected permutations of supply voltage, as indicated by block 212, a determination is made at block 214 as to whether calibration has been performed for all of the selected permutations of temperature. If not, the temperature is set to the next selected temperature permutation, as indicated by block 215. The process then returns to block 202 and 203 and the temperature and REFCLK frequency are again set to their initial values, as indicated by loop 219. The calibration process represented by blocks 204-211 is then performed and calibration settings are determined and saved for all of the selected REFCLK frequencies at the new temperature set at block 215 and for all of the selected permutations of supply voltage. This entire process continues to be repeated for all permutations of supply voltage and temperature until a determination is made at block 214 that calibration has been performed for the last permutation of temperature. At that point, all of the data needed to produce a characteristic plot of the type shown in FIG. 7 has been obtained, and the process returns to block 60 shown in FIG. 5.

FIG. 10 illustrates a flow chart that is very similar to the flow chart illustrated in FIG. 9. However, in FIG. 9, the REFCLK frequency loop 217 was the innermost loop with respect to the supply voltage and temperature loops 218 and 219, respectively. In contrast, in FIG. 10 the REFCLK frequency loop 217 is the outermost loop with respect to the supply voltage and temperature loops 218 and 219, respectively. In all other respects, the operations performed by the algorithms are essentially the same. Other variations may also be made to the algorithms represented by these flow charts. For example, although FIGS. 9 and 10 depict the temperature loop 219 as being outside of the supply voltage loop 218, the algorithm could easily be modified such that the supply voltage loop 218 is outside of the temperature loop. Those skilled in the art will understand, in view of the description provided herein, the manner in which such modifications can be made.

It can be seen from the above description that the method of the invention enables a determination to be easily and quickly made as to whether a PLL under test may be unable to maintain phase and frequency lock. The measurements of VCO output clock frequency only need to be taken at the supply voltage and/or temperature permutations that correspond to the extremes, or corners. The result is a vast reduction when compared to the number of measurements that must be obtained when using the aforementioned direct measurement approach. This reduction in the amount of time required means that more PLLs can be tested, which reduces the possibility that a potentially defective PLL will be shipped to a customer. In addition, the method of the invention is extremely accurate because it does not rely on testing at every possible permutation of temperature and supply voltage, as is the case with the direct measurement approach. Consequently, potential problems associated with failing to test at a set of conditions that might have resulted in the PLL failing to lock are obviated.

In addition, the method of the invention may be quickly and easily performed in software. FIG. 11 illustrates a block diagram of the apparatus 230 of the invention in accordance with an exemplary embodiment. The apparatus 230 comprises a processor 240 programmed to execute testing software 250, and a memory element 260 for storing the coarse frequency tuning calibration settings and information describing the relationship between the calibration settings, the input reference clock frequencies and the VCO output clock frequencies. The testing software 250 is computer code for carrying out the processes represented by the flow chart shown in FIG. 5. The processor 240, the testing software 250 and the memory element 260 together make up logic for performing the steps represented by blocks 60 and 70 in FIG. 5. The calibration process represented by block 50 in FIG. 5 is typically performed in hardware within the PLL. However, steps represented by blocks 60 and 70 could be performed solely in hardware or in a combination of hardware and software or firmware.

In addition, the processor 240 may execute software that generates the plots shown in FIGS. 6, 7 and 8 and causes them to be displayed on a display monitor 270 to allow a user to determine whether a PLL under test passed or failed, as well as to make other determinations such as, for example, whether the PLL is more sensitive to supply voltage or temperature variations at lower or higher frequencies. For example, a spreadsheet program such as the Microsoft Excel spreadsheet program may be used to generate the graph shown in FIG. 8.

It should be noted that the invention has been described with reference to preferred and exemplary embodiments. The invention is not limited to the preferred and exemplary embodiments described herein. It will be understood by those skilled in the art in view of this disclosure that modifications can be made to the embodiments described herein, and that all such modifications are within the scope of the invention.

What is claimed is:

1. An apparatus for testing a calibrated voltage-controlled oscillator (VCO) to determine whether the VCO has adequate fine frequency tuning capability, the apparatus comprising:

first logic configured to determine a range of coarse frequency tuning calibration settings of the VCO based on a plurality of coarse frequency tuning calibration settings obtained during a coarse frequency tuning calibration process; and second logic configured to determine whether a fine frequency tuning capability of the VCO is adequate based on the determined range of coarse frequency tuning calibration settings, wherein the VCO has a fine frequency tuning range, and wherein the second logic determines whether the fine frequency tuning capability of the VCO is adequate by determining whether the fine frequency tuning range is at least as great as the coarse frequency tuning calibration settings range.

2. The apparatus of claim 1, wherein the first and second logic are implemented in software being executed by a computer.

3. The apparatus of claim 1, wherein the first and second logic are implemented in hardware.

4. The apparatus of claim 1, wherein the coarse frequency tuning calibration settings are determined for different input reference clock frequencies and different supply voltages.

5. The apparatus of claim 1, wherein the coarse frequency tuning calibration settings are determined for different input reference clock frequencies and different temperatures.

6. The apparatus of claim 1, wherein the coarse frequency tuning calibration settings are determined for different input reference clock frequencies, different temperatures and different supply voltages.

7. The apparatus of claim 1, wherein the coarse frequency tuning calibration settings are determined for different supply voltages.

8. The apparatus of claim 1, wherein the coarse frequency tuning calibration settings are determined for different temperatures.

9. A method for testing a calibrated voltage-controlled oscillator (VCO) to determine whether the VCO has adequate fine frequency tuning capability, the method comprising:
  determining a range of coarse frequency tuning calibration settings based on a plurality of coarse frequency tuning calibration settings obtained during a VCO coarse frequency tuning calibration process; and
  determining whether a fine frequency tuning capability of the VCO is adequate based on the determined range of coarse frequency tuning calibration settings,
  wherein the VCO has a fine frequency tuning range, and wherein the determination as to whether the fine frequency tuning capability of the VCO is adequate is made by determining whether the fine frequency tuning range is at least as great as the coarse frequency tuning calibration settings range.

10. The method of claim 9, wherein the method is performed by software being executed by a computer.

11. The method of claim 9, wherein the method is performed in hardware.

12. The method of claim 9, wherein the coarse frequency tuning calibration settings are determined for different input reference clock frequencies.

13. The method of claim 9, wherein the coarse frequency tuning calibration settings are determined for different temperatures.

14. The method of claim 9, wherein the coarse frequency tuning calibration settings are determined for different supply voltages.

15. A method for testing a calibrated voltage-controlled oscillator (VCO) to determine whether the VCO has adequate fine frequency tuning capability, the method comprising:
  performing a coarse frequency tuning calibration process to determine coarse frequency tuning calibration settings at a plurality of selected input reference clock frequencies and at a plurality of temperature and supply voltage conditions;
  determining a range of coarse frequency tuning calibration settings based on the determined coarse frequency tuning calibration settings obtained during the coarse frequency tuning calibration process; and
  determining whether a fine frequency tuning capability of the VCO is adequate based on the determined range of coarse frequency tuning calibration settings,
  wherein the VCO has a fine frequency tuning range, and wherein the determination as to whether the fine frequency tuning capability of the VCO is adequate is made by determining whether the fine frequency tuning range is at least as great as the coarse frequency tuning calibration settings range.

16. The method of claim 15, wherein the plurality of temperature and supply voltage conditions correspond to a minimum temperature, a minimum supply voltage, a maximum temperature, and a maximum supply voltage.

17. A computer program for testing a calibrated voltage-controlled oscillator (VCO) to determine whether the VCO has adequate fine frequency tuning capability, the computer program being embodied on a computer-readable medium, the program comprising:
  a first code segment for determining a range of coarse frequency tuning calibration settings based on a plurality of coarse frequency tuning calibration settings obtained during a VCO coarse frequency tuning calibration process; and
  a second code segment for determining, based on the determined range of coarse frequency tuning calibration settings, whether a fine frequency tuning capability of the VCO is adequate,
  wherein the VCO has a fine frequency tuning range, and wherein the second code segment determines whether the fine frequency tuning capability of the VCO is adequate by determining whether the fine frequency tuning range is at least as great as the coarse frequency tuning calibration settings range.

* * * * *